United States Patent
Williams et al.

(10) Patent No.: US 8,299,771 B2
(45) Date of Patent: Oct. 30, 2012

(54) METHODS AND SYSTEMS FOR DRIVING A LOAD

(75) Inventors: Kyle Shawn Williams, Howell, MI (US); Joseph Funyak, Rochester Hills, MI (US)

(73) Assignee: Infineon Technologies AG, Neubiberg (DE)

( * ) Notice: Subject to any disclaimer, the term of this patent is extended or adjusted under 35 U.S.C. 154(b) by 1735 days.

(21) Appl. No.: 11/606,691

(22) Filed: Nov. 30, 2006

(65) Prior Publication Data
US 2008/0129347 A1    Jun. 5, 2008

(51) Int. Cl.
*G05F 1/00*      (2006.01)
(52) U.S. Cl. ........................................................ 323/283
(58) Field of Classification Search .................. 323/222, 323/223, 271, 282, 283, 284, 285
See application file for complete search history.

(56) References Cited

U.S. PATENT DOCUMENTS

| | | | |
|---|---|---|---|
| 5,404,303 A | 4/1995 | Pattantyus et al. | |
| 5,729,164 A | 3/1998 | Pattantyus | |
| 5,808,471 A | 9/1998 | Rooke et al. | |
| 6,067,490 A * | 5/2000 | Ichimaru et al. | 701/37 |
| 6,396,252 B1 * | 5/2002 | Culpepper et al. | 323/284 |
| 6,404,612 B1 | 6/2002 | Pattantyus | |
| 6,674,272 B2 * | 1/2004 | Hwang | 323/284 |
| 7,180,274 B2 * | 2/2007 | Chen et al. | 323/222 |
| 7,679,350 B2 * | 3/2010 | Falvey et al. | 323/284 |
| 2005/0206358 A1 * | 9/2005 | Van Der Horn et al. | 323/282 |
| 2007/0120547 A1 * | 5/2007 | Tateishi et al. | 323/282 |

OTHER PUBLICATIONS

"Ultimate Power—Perfect Control" Complete Automotive Solutions from Infineon, Automotive Power Selection Guide, Reprinted from the Internet at: www.infineon.com/power, 26 pgs.

* cited by examiner

*Primary Examiner* — Nguyen Tran
(74) *Attorney, Agent, or Firm* — Eschweiler & Associates, LLC

(57) ABSTRACT

In one embodiment, a circuit can selectively adjust a current for driving a load. The circuit includes a sensor configured to measure a magnetic field associated with the current and provide a sensor voltage representative thereof. A control circuit is configured to selectively adjust the current as a function of the sensor voltage and a time-varying voltage threshold. Other methods and systems are also disclosed.

4 Claims, 2 Drawing Sheets

METHODS AND SYSTEMS FOR DRIVING A LOAD

FIELD OF THE INVENTION

The present invention relates generally to methods and systems for driving a load, and more specifically to methods and systems for driving a load as a function of a magnetic field associated therewith.

BACKGROUND OF THE INVENTION

In many facets of today's rapidly changing economy, successful businesses must deliver quality products and maximize value to their customers to survive. Even in the high-tech electronics arena, this simple reality still holds true.

Two ways in which electronics companies deliver value is by providing better integrated solutions and by providing more reliable parts. Accordingly, there is a need in the electronics industry to deliver a circuit that can drive a load in an efficient manner.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

In one embodiment, a circuit can selectively adjust a current for driving a load. The circuit includes a sensor configured to measure a magnetic field associated with the current and provide a sensor voltage representative thereof. A control circuit is configured to selectively adjust the current as a function of the sensor voltage and a time-varying voltage threshold.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with respect to the accompanying drawings in which like numbered elements represent like parts. The figures and the accompanying description of the figures are provided for illustrative purposes and do not limit the scope of the claims in any way.

Figure 1:
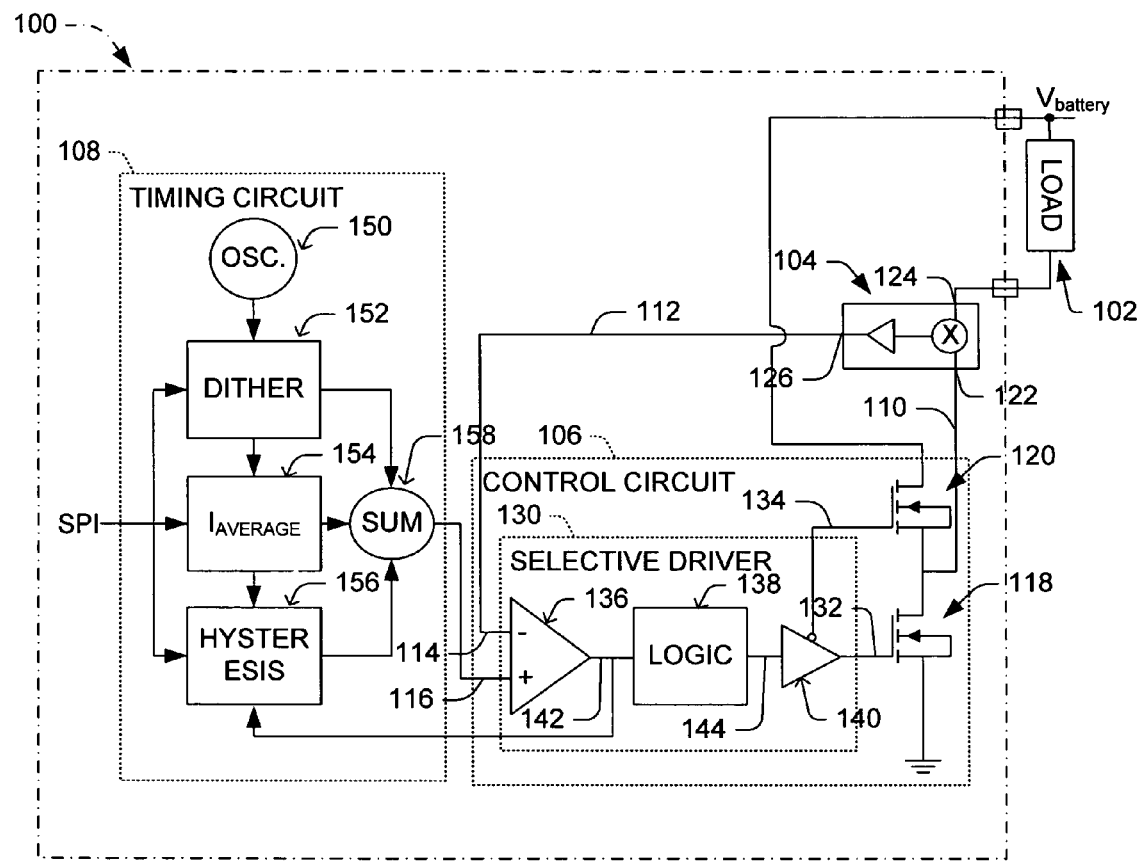
FIG. 1 is a block diagram of one embodiment of a circuit for driving a load.

FIG. 1 shows one embodiment for a circuit 100 configured to drive a load 102 in an efficient manner. In one embodiment, the circuit 100 can manage a current that is delivered to the load 102 by selectively increasing or decreasing the current to properly drive the load, such that the current is maintained between an upper limit and a lower limit. In the illustrated embodiment, the circuit 100 includes several components: including a sensor 104, a control circuit 106 and a timing circuit 108.

In the illustrated embodiment, the sensor 104 can measure a magnetic field (indicated by the "X" in the circle in sensor 104), wherein the magnetic field is associated with the current that is delivered to the load along node or connection 110. Based on the measured magnetic field due the current, the sensor 104 can provide a sensor voltage along connection 112 to a first input 114 of the control circuit 106. Depending on relationship between the sensor voltage at the first input 114 of the control circuit 106 and a time varying voltage threshold at a second input 116 of the control circuit 106, the control circuit 106 can selectively adjust the current used to drive the load 102. In one embodiment, when the sensor voltage at first input 114 is less than the time varying voltage threshold on node 116, the control circuit 106 increases the current delivered to the load by enabling a first device 118 and deactivating a second device 120. Conversely, when the sensor voltage at first input 114 is more than the time varying voltage threshold on node 116, the control circuit 106 decreases the current delivered to the load by enabling the second device 120 and deactivating the first device 118. Thus, the control circuit 106 can selectively adjust the current between an upper limit and a lower limit to efficiently drive the load, wherein the upper limit relates to the first device 118 and the lower limit relates to the second device 120.

The sensor 104 can be a sensor that measures the magnetic field due to a current and provides a sensor voltage that is representative thereof. In one embodiment, for example, the sensor could be a Hall Effect device such as a Hall Effect current sensor. The illustrated sensor has three terminals. A voltage (which is proportional to the current delivered to the load) is applied across first and second terminals 122 and 124, while the third terminal 126 provides a sensor voltage that is proportional to the current being sensed. Thus, as the current through the sensor increases, the sensor voltage typically increases proportionally. Similarly, as the current through the sensor decreases, the sensor voltage typically decreases proportionally, although other conventions could also be used.

When suitably packaged, Hall Effect devices are immune to various environmental contaminants, such as dust, dirt, mud, and water. Further, because they detect electrons flowing through a conductor (e.g., wire 110) that produce a magnetic field, Hall Effect devices may be non-contacting or "contactless" in that they have no moving parts. Because such sensors may be non-contacting, they typically do not suffer from wear and tear to the same extent as "contacting" sensors, such as gears and traditional mechanical parts. These characteristics make Hall Effect devices better for sensing than alternative means such as optical and electromechanical sensing, depending on the implementation.

After the sensor 104 provides the sensor voltage, the sensor voltage is provided at the first input 114 of the control circuit 106, one embodiment of which is now discussed in more detail. In general, the control circuit 106 compares the sensor voltage at the first input 114 to a time-varying voltage threshold at the second input 116 to selectively alter the current that is delivered to the load 102.

In the illustrated embodiment, the control circuit 106 comprises a selective driver 130 configured to provide both a drive signal on node 132 and an inverted drive signal on node 134 as a function of the sensor voltage and the time-varying voltage threshold. On the one hand, if the sensor voltage is less than the time-varying voltage threshold, the selective driver 130 can drive the drive signal high on node 132, thereby enabling the first device 118 and coupling node 110 to a relatively low voltage (e.g., GND). Thus, in this scenario the first device 118 will turn on and put a relatively large bias across the load, thereby increasing the current to the load 102. Further, in this scenario, the selective driver 130 can drive the inverted drive signal low on node 134 (e.g., opposite the drive signal), thereby deactivating the second device 120. By deactivating the second device 120, the selective driver 130 prevents current from flowing directly from $V_{battery}$ to GND over the first and second devices, and thereby limits excess power dissipation. This limitation on excess power dissipation potentially improves the operation of the circuit, for example by reducing heating of the part.

On the other hand, if the sensor voltage on first input 114 is more than the time-varying voltage threshold on second input 116, the selective driver 130 can drive the inverted drive signal on node 134 high, thereby enabling the second device 120 and coupling node 110 to a relatively high voltage (e.g., $V_{battery} - V_{DS\ second\ device\ 120}$). Thus, in this scenario the second device 120 will turn on and the voltage across the load will be relatively low, thereby decreasing the current supplied to the load. Further, in this scenario, the selective driver 130 can drive the drive signal low on node 132, thereby deactivating the first device 118. Again, by deactivating the first device 118, the selective driver 130 prevents current from flowing directly from $V_{battery}$ to GND over the first and second devices, and thereby limits excess power dissipation.

In order to selectively increase or decrease the current supplied to the load, the illustrated selective driver 130 includes a comparator 136, a logic block 138, and a gate driver 140. The comparator 136 compares the sensor voltage at the first input 114 to the time-varying voltage threshold at the second input 116, and provides a comparator output voltage at a comparator output node that switches depending on which voltage 114, 116 is higher. The comparator output voltage is provided to the logic block 138 and the hysteresis block 156 of the timing circuit 108. The logic block 138 receives the comparator output voltage and may suitably adjust the voltage thereof to provide a logical drive signal at node 144. This logical drive signal may, for example, be delayed or be related to the comparator output voltage by some other state-machine included in the logical block. The logical drive signal is then passed to the gate driver 140, which may amplify or otherwise condition the signal to provide the drive signal on 132 and the inverted drive signal on 134 to the second device 120, respectively.

A timing circuit 108 can be operably coupled to the second input 116 of the control circuit 106, and various embodiments of a timing circuit are now discussed in more detail, although it will be appreciated that these are but a few of the ways in which a timing circuit can be implemented. In one embodiment, the timing circuit 108 can provide an average current upon which a periodic wave is superimposed and wherein the periodic wave has a frequency that is associated with a load frequency at which the load is driven. In the illustrated embodiment, the timing circuit 108 includes several components to provide this or other desired functionality. The illustrated components are an oscillator 150, a dither block 152, average current block 154, a hysteresis block 156 and a summation block 158.

The oscillator 150 provides a base frequency for the dither block 152. In one embodiment, this base frequency could be approximately 200 kHz for example, although in other embodiments it could be any suitable value.

The dither block 152 receives the base frequency, which it then suitably modifies to facilitate driving the load. In one embodiment, the dither block 152 provides a periodic wave that is a triangular wave of approximately 100 Hz that corresponds to the frequency at which the load is driven. For example, in one embodiment where the load 102 includes a solenoid, the dither block 152 provides a periodic wave that is superimposed on the average current to move the solenoid armature back and forth to avoid static friction (stiction).

The average current block 154 provides a set point or average current, upon which the periodic wave is superimposed. The summation block 158 combines the periodic wave of the dither block 152 with the average current and any hysteresis to provide the time-varying voltage threshold. Any or all of the values of the dither block 152, average current 154, or hysteresis 156 may be suitably adjusted by changing the values of a serial-parallel interface (SPI) input, or any other suitable means.

In addition to or in substitution of one or more of the illustrated components, the illustrated communication system and other systems of the invention include suitable circuitry, state machines, firmware, software, logic, etc. to perform the various methods and functions illustrated and described herein, including but not limited to the methods described below. While the methods illustrated herein are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of systems which are illustrated and described herein (e.g., circuit 100 in FIG. 1) as well as in association with other systems not illustrated, wherein all such implementations are contemplated as falling within the scope of the present invention and the appended claims.

Figure 2:
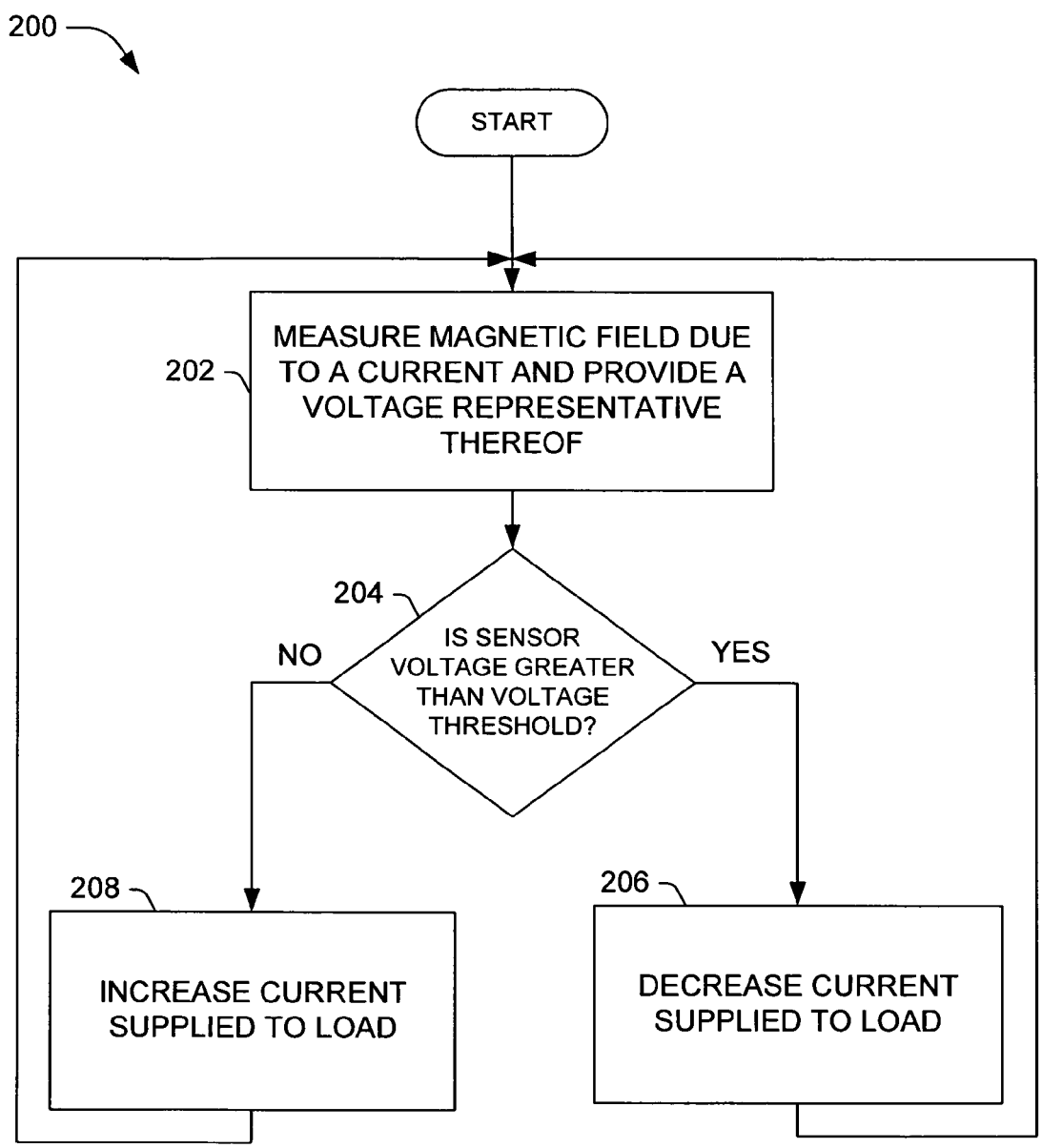
FIG. 2 is a flow chart of one method for driving a load.

Referring now to FIG. 2, one can see one embodiment of a method 200 in accordance with aspects of the present invention. In the method 200, a magnetic field due to a current is measured, and a sensor voltage representative thereof is provided at 202.

At 204, a determination is made as to whether the sensor voltage is greater than a time-varying voltage threshold. If so (YES at 204), then the method selectively decreases the current supplied to the load at 206. In one embodiment, this decrease in current to the load may be carried out in a manner so as to limit excess power dissipation. Thus, in one embodiment, the may be carried out by providing complimentary signals (e.g., drive signal at 132 and inverted drive signal at 134), that drive complimentary devices (e.g., first device 118 and second device 120, respectively) such that one of the complimentary devices is in an off-state while the other complimentary device is in an on-state.

If the sensor voltage is not greater than the threshold voltage (NO at 204), then the method selectively increases the current supplied to the load at 208. In one embodiment, this increase in current to the load may also be carried out in a manner so as to limit excess power dissipation. After the current is adjusted in 206 or 208, the method 200 returns to 202 and the magnetic field is again measured. Thus, the method 200 can continuously monitor a magnetic field and continuously and dynamically alter the current delivered to the load as a function of the magnetic field.

Although the invention has been illustrated and described with respect to one or more implementations, alterations and/ or modifications may be made to the illustrated examples without departing from the spirit and scope of the appended claims.

For example, in one embodiment, the load could be a solenoid. Further such a solenoid could be employed in an automotive system, such as an automatic transmission. In other embodiments, the load could be any other loads that a user desires to drive at a frequency.

Further, although in the illustrated embodiment, the first device and the second device are n-type metal-oxide semiconductor field effect transistors (MOSFETs), p-type MOSFETS could also be used. Further, the first and second devices could also include these and other types of switching devices (e.g., transistors, bipolar junction transistors (BJTs), vacuum tubes, etc.).

In addition, although various embodiments may mention that a current delivered to the load could be increased if one voltage exceeds another, the conventions used herein could also be reversed. Thus, one will understand that increases or decreases in voltage or other variables could be transposed or otherwise rearranged in various embodiments.

Further, in various embodiments, portions of the circuit may be integrated into an integrated circuit, although in other embodiments the circuit may be comprised of discrete devices. In one embodiment, the first and second devices may be integrated into a single IC with the control circuit and portions of the timing circuit. The sensor may be integrated into the same IC as the control circuit, or may be integrated into the same package as the control circuit, or may be integrated onto the same PCB board, or may be otherwise associated with the control circuit; depending on the implementation.

Although the invention has been shown and described with respect to a certain aspect or various aspects, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A circuit to selectively adjust a current for driving a load, comprising:
   a sensor configured to measure a magnetic field associated with the current and provide a sensor voltage representative thereof;
   a control circuit configured to selectively adjust the current as a function of the sensor voltage and a time-varying voltage threshold; and
   a timing circuit, the timing circuit comprising:
      an oscillator;
      a serial to parallel interface (SPI);
      a dither module having an first input coupled to an output of the oscillator and having a second input coupled to the SPI;
      an average current block having an input coupled to the SPI; and
      a hysteresis block having an input coupled to the SPI.

2. The circuit of claim 1, further comprising:
   a summation element configured to sum signals from the dither module, the average current block, and the hysteresis block to thereby provide the time-varying voltage threshold to the control block.

3. The circuit of claim 2, further comprising:
   a control path coupling the control circuit to the hysteresis block;
   wherein the control circuit provides a feedback signal to the hysteresis block via the control path.

4. The circuit of claim 3, wherein the control circuit comprises:
   a selective driver configured to provide both a drive signal and an inverted drive signal as a function of the sensor voltage;
   a first device configured to increase the current as a function of the drive signal if the sensor voltage favorably compares to the time-varying voltage threshold; and
   a second device configured to decrease the current as a function of the inverted drive signal if the sensor voltage does not favorably compare to the time-varying voltage threshold;
   wherein the control path couples the selective driver to the hysteresis block.

* * * * *